(12) United States Patent
Yang

(10) Patent No.: US 7,595,554 B2
(45) Date of Patent: Sep. 29, 2009

(54) INTERCONNECT STRUCTURE WITH DIELECTRIC AIR GAPS

(75) Inventor: Chih-Chao Yang, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 12/125,971

(22) Filed: May 23, 2008

(65) Prior Publication Data

US 2008/0217731 A1 Sep. 11, 2008

Related U.S. Application Data

(62) Division of application No. 11/456,721, filed on Jul. 11, 2006, now Pat. No. 7,396,757.

(51) Int. Cl.
*H01L 21/4763* (2006.01)

(52) U.S. Cl. .............. 257/750; 257/758; 257/774; 257/E21.235; 257/E21.581; 257/E23.144

(58) Field of Classification Search ........ 438/638, 438/618, 622, 637, 640, 658, 660, 663, 666, 438/669, 672, 687, 701, 720, 742; 257/760, 257/750, 758, 774, E21.235, 581, E23.144, 257/157

See application file for complete search history.

(56) References Cited

U.S. PATENT DOCUMENTS

| | | | |
|---|---|---|---|
| 5,949,143 A | 9/1999 | Bang | |
| 6,104,077 A | 8/2000 | Gardner et al. | |
| 6,140,200 A * | 10/2000 | Eldridge | 438/396 |
| 6,251,798 B1 * | 6/2001 | Soo et al. | 438/758 |
| 6,329,279 B1 | 12/2001 | Lee | |
| 6,440,839 B1 | 8/2002 | Partovi et al. | |
| 6,448,177 B1 * | 9/2002 | Morrow et al. | 438/638 |
| 6,465,730 B1 * | 10/2002 | Pluymers et al. | 174/28 |
| 6,472,266 B1 * | 10/2002 | Yu et al. | 438/241 |
| 6,635,967 B2 | 10/2003 | Chang et al. | |
| 6,710,449 B2 * | 3/2004 | Hyoto et al. | 257/758 |
| 6,780,753 B2 | 8/2004 | Latchford et al. | |
| 6,861,332 B2 | 3/2005 | Park et al. | |
| 7,022,582 B2 * | 4/2006 | Sezi | 438/422 |
| 7,071,091 B2 * | 7/2006 | Clarke et al. | 438/622 |
| 7,294,568 B2 * | 11/2007 | Goodner et al. | 438/619 |
| 7,348,280 B2 * | 3/2008 | Hsu et al. | 438/778 |
| 7,466,025 B2 * | 12/2008 | Goodner et al. | 257/750 |
| 2005/0062165 A1 | 3/2005 | Saenger et al. | |
| 2005/0230836 A1 * | 10/2005 | Clarke et al. | 257/760 |
| 2006/0019482 A1 | 1/2006 | Su et al. | |
| 2007/0096319 A1 * | 5/2007 | Hsu et al. | 257/750 |
| 2008/0014731 A1 * | 1/2008 | Yang | 438/597 |
| 2008/0079172 A1 * | 4/2008 | Hsu et al. | 257/774 |

* cited by examiner

*Primary Examiner*—Michael S Lebentritt
(74) *Attorney, Agent, or Firm*—Joseph Petrokaitis

(57) ABSTRACT

An interconnect structure with improved performance and capacitance by providing air gaps inside the dielectric layer by use of a multi-phase photoresist material. The interconnect features are embedded in a dielectric layer having a columnar air gap structure in a portion of the dielectric layer surrounding the interconnect features. The interconnect features may also be embedded in a dielectric layer having two or more phases with a different dielectric constant created. The interconnect structure is compatible with current back end of line processing.

2 Claims, 4 Drawing Sheets

INTERCONNECT STRUCTURE WITH DIELECTRIC AIR GAPS

CROSS-REFERENCE TO RELATED APPLICATION

This application is a divisional of currently co-pending U.S. patent application Ser. No. 11/456,721, filed on Jul. 11, 2006, the subject matter of which is incorporated herein by reference in its entirety.

BACKGROUND OF THE INVENTION

The present invention relates generally to the fabrication of semiconductor devices, and more particularly to methods and structures that implements air gaps in the dielectric layers.

As semiconductor devices continue to shrink the corresponding reduction in interconnect linewidths has increased line resistance. The reduced spacing between interconnects further creates more parasitic capacitance. This results in circuit signal delay and lower chip speed and performance.

In order to reduce the BEOL (back end of line) interconnect portion of circuit delay, the conventional silicon dioxide dielectric (k of approximately 4.0) is being replaced with dense lower-k films with k values of approximately 3.0. For further performance improvement, more dielectric capacitance is required (k less than 2.5) for advanced devices.

Capacitance improvements can be made with new porous low k dielectrics, however most of the porous materials have relatively weak mechanical properties as compared to dense dielectrics. It is also a significant challenge for the current BEOL process to integrate these materials with other module processes. For example, the conventional CMP (chemical mechanical polish) process has difficulty polishing a low mechanical-module porous dielectric, and the conventional PVD (plasma vapor deposition) diffusion barrier deposition technology cannot offer reasonable coverage on the surface of porous dielectrics.

Another technique to improve capacitance by lowering the dielectric constant is the creation of air gaps between conducting lines. While silicon dioxide has a dielectric constant of about and greater, the dielectric constant of air is approximately 1.

U.S. Pat. No. 5,949,143 (Bang) forms air gaps between two adjacent interconnects. The air gap is covered by a diffusion barrier layer and then by an insulating layer to allow the integration with upper interconnect levels.

U.S. Pat. No. 6,440,839 (Partovi) forms small air gaps between two adjacent interconnections by using "tenon-wetting" sidewall spacers on the interlevel dielectric to inhibit deposition of metal. This technique is limited to forming small air gaps between two widely-spaced interconnects.

U.S. Pat. No. 6,861,332 (Park) discloses the use of an exhaust vent to form an air gap in the dielectric.

U.S. Pat. No. 6,780,753 (Latchford) forms air gaps by depositing a dielectric material between the conductors, depositing a porous layer over the conductors and dielectric, and then stripping the dielectric material out of the space between the conductors through the porous layer leaving air gaps between the conductors.

U.S. Pub. No. 2005/0062165 (Saengar) forms closed air gap interconnect structures.

U.S. Pub. No. 2006/0019482 (Su) forms air gaps between a plurality of dummy stakes and a plurality of metal lines.

Therefore a need exists for a structure that enhances the reliability of the interconnection which is compatible with current BEOL processing.

An object of the present invention is to provide performance and capacitance improvements by creating air gaps inside dense dielectric materials.

Another object of the present invention is to provide these improvements without new or exotic porous dielectric materials and in a manner compatible with current BEOL processing.

BRIEF SUMMARY OF THE INVENTION

The present invention provides an interconnect structure comprising interconnect features embedded in a first dielectric layer, the interconnect features having patterned exposed interconnect areas; a cap layer on the exposed interconnect areas; a columnar air gap structure in a portion of the first dielectric layer surrounding the exposed interconnect areas; and a second dielectric material on the columnar air gap structure and cap layer.

In another embodiment there is provided an interconnect structure comprising: interconnect features embedded in a first dielectric layer, the interconnect features having patterned exposed interconnect areas; a cap layer on the exposed interconnect areas; a two-k dielectric material structure in a portion of the first dielectric layer surrounding the exposed interconnect areas; and a second dielectric material on the columnar air gap structure and cap layer.

In another embodiment of the present invention there is provided a method for forming an interconnect structure, comprising: forming interconnect features embedded in a first dielectric layer deposited on a substrate, the interconnect features having patterned exposed interconnect areas; forming a second layer material on the portion of the first dielectric layer surrounding the exposed interconnect areas; forming a cap layer on the exposed interconnect areas; depositing a multi-phase photoresist on the second layer material and the cap layer; and separating the portion of the multi-phase photoresist contiguous with the second layer material into a pattern of different phase materials.

The method further comprises forming columnar air gaps in the portion of the first dielectric layer surrounding the exposed interconnect areas and removing the multi-phase photoresist and the second layer material with a RIE process. The method further comprises: depositing a second dielectric material on the pattern of different phase materials and said cap layer.

The second layer material preferably has a hydrophilic surface. The second layer material preferably has a thickness of approximately 20 Å to approximately 800 Å.

The second layer material is preferably a dielectric, an insulator or a semiconductor.

The interconnect features preferably comprise materials selected from the group consisting of Cu, Al, Al Cu and W. The first dielectric layer is preferably a low dielectric constant material and preferably has a thickness of approximately 500 Å to approximately 10,000 Å.

The cap layer is preferably a Co alloy with Co and materials selected from the group consisting of W, P, B, Sn, and Pd. The cap layer preferably has a thickness of approximately 50 Å to approximately 300 Å. In a preferred embodiment the cap layer material is selected from the group consisting of CoSnP, CoWP, Pd, and Ru. The cap layer preferably has a hydrophobic surface.

In a preferred embodiment the multi-phase photoresist is a two-phase photoresist having a first phase (A) photoresist and a second phase (B) photoresist. The two-phase photoresist preferably has a thickness of approximately 50 Å to approximately 1000 Å.

The first phase (A) photoresist is preferably comprised of silica, organosilanes and a material selected from the group consisting of amines, amides, aldehydes and hydrosys, and the second phase (B) photoresist is preferably a polymer. In a preferred embodiment the second phase (B) photoresist has a higher etching-resistance than the first phase (A) photoresist.

The method may further comprises the step of removing the first phase (A) photoresist. The second dielectric material is preferably a low dielectric constant material.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The present invention provides an interconnect structure with improved performance and capacitance by creating air gaps inside dielectric materials.

The present invention improves the capacitance of interconnect devices by providing an air gap structure inside the interlevel dielectric created by a multi-phase photoresist material. The present invention is compatible to the current BEOL process flow, which does not require new module development for creating etching profiles, better barrier coverage, handling CMP process.

Figure 1A:
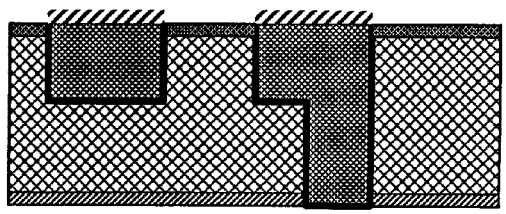
FIGS. 1A-1D are schematic cross-sectional views illustrating a conventional damascene structure with air gaps.
Figure 1C:
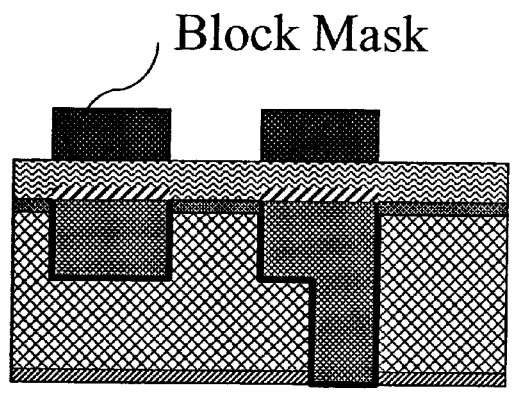
Figure 1B:
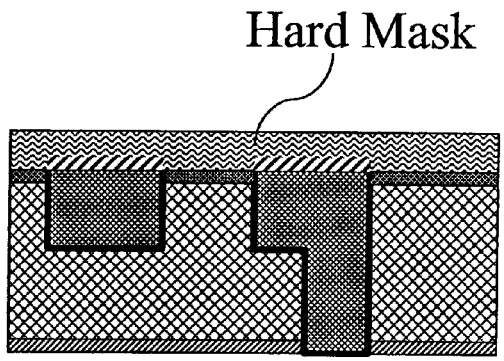
Figure 1D:
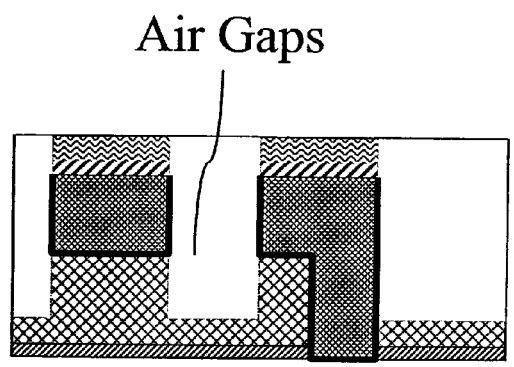

Referring to FIGS. 1A-1D there is illustrated a schematic representation of a conventional method for creating air gaps in a damascene structure. FIG. 1A illustrates the selective cap deposition on the interconnects embedded in the dielectric. FIG. 1B illustrates the deposition of a hardmask layer. FIG. 1C illustrates the deposition of a block mask for patterning and etching. FIG. 1D illustrates removing the dielectric surrounding the interconnects and thereby forming air gaps.

This process requires an extra mask resulting in increased cost and process time, as well as the increased yield loss associated with aligning the block mask to the patterned interconnect features.

According to the present invention the air gap structure is created from a multi-phase photoresist material, such as Diblock for example, which has different etching selectivity during RIE (reactive ion etching) processing. The present invention provides the advantage of creating the air gaps compatibly with current Cu dual damascene processing without an extra mask process. The process cost of the present invention is therefore lower than current methods. The present invention also has better technology extendibility since it is not limited to any particular dielectric materials.

Figure 2A:
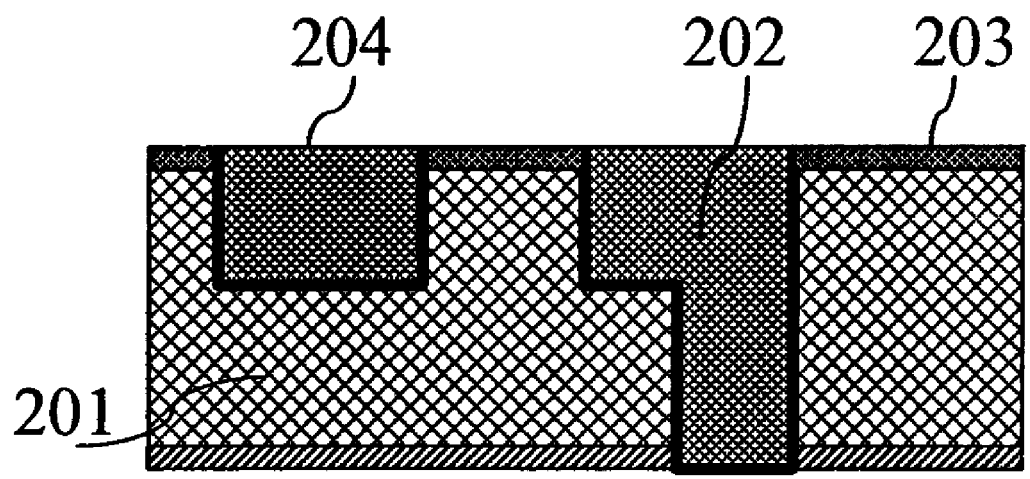
FIG. 2A-2E are schematic cross-sectional views illustrating a method for forming air gaps in a damascene structure according to the present invention.

Detailed methods for fabricating the air gap interconnect structure proposed in the present invention are described with reference to FIGS. 2A-2F. Referring now to FIG. 2A, conductive interconnects 202 are embedded in an insulator layer 201, such as a low dielectric constant material, and a second layer material 203. Second layer material 203 preferably has a "hydrophilic surface" for later local selective phase separation. The embedded conductive interconnects 202 also have an exposed surface 204 which is not embedded in the insulator 201.

The thickness of the second layer material 203 is preferably between 20 Å and 800 Å. Second layer material 203 can be a dielectric, insulator, or semiconductor. Conductive interconnect material 202 is preferably Cu, Al, Al(Cu), or W. Preferably, the insulator layer 201 is a low-k material with a thickness between 500 and 10,000 Å.

Figure 2B:
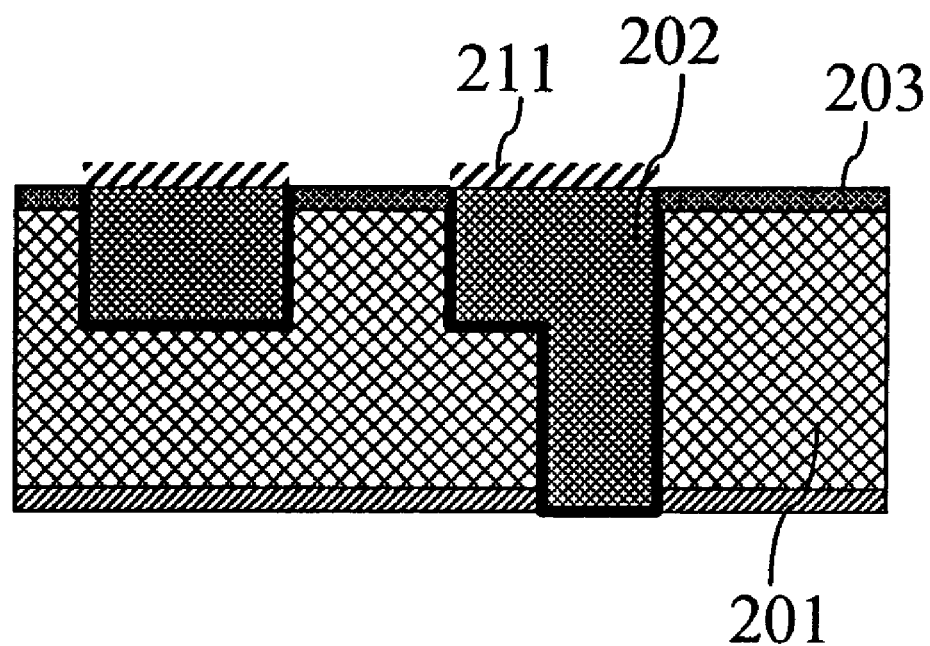

Referring now to FIG. 2B, the exposed surface 204 of the interconnect conductor 202 is selectively capped with a cap layer 211. This cap layer 211 is preferably CoWP which serves both as a passivation and diffusion barrier layer. Preferably, the cap layer 211 layer thickness is between 50 and 200 Å. In addition to CoWP, other materials like CoSnP, Pd, and Ru are also good candidates to serve this function. It's preferred that the cap layer material 211 has a "hydrophobic" surface for later random phase formation. The selective cap deposition will also create a local topography, as well as provide two different surfaces, i.e. a hydrophobic metallic cap surface 211 and a hydrophilic dielectric hardmask surface 203.

Figure 2C:
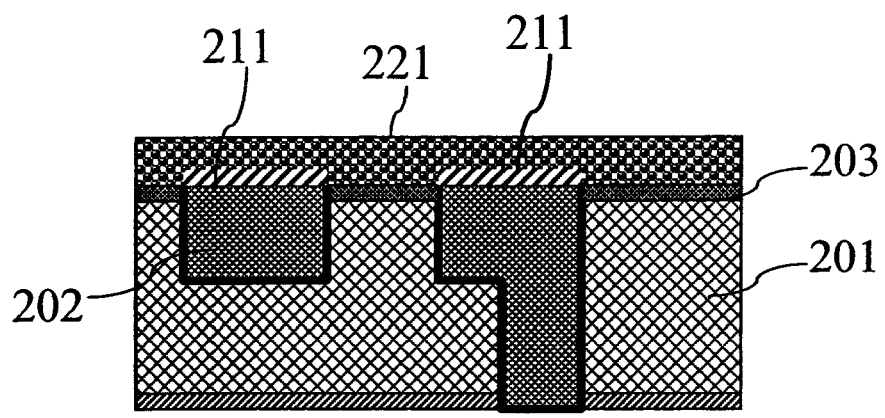

Referring now to FIG. 2C, a multi-phase photoresist material 221 is deposited on the surface of the hardmask 203 and cap layer 211. In a preferred embodiment the multi-phase photoresist material 221 is a two-phase photoresist, such as Diblock. The two-phase photoresist layer 221 preferably has a thickness between 50 and 1000 Å. The first phase (A) is preferably comprised of silica, organosilanes and amines, amides, aldehydes or hydrosys. The second phase (B) is preferably a conventional polymer photoresist.

Figure 2D:
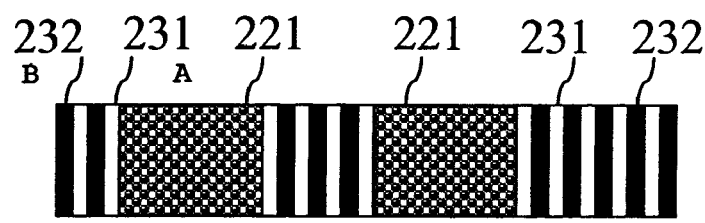
Figure 2D:
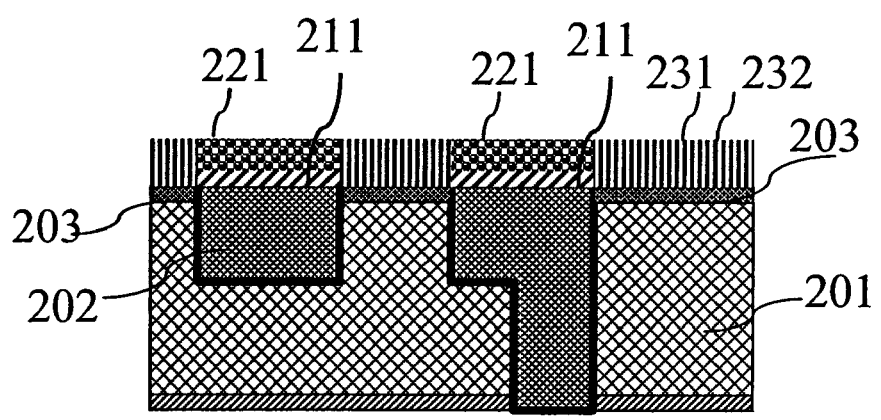

Referring now to FIG. 2D, there is illustrated by top view 2D(a) and cross-section view 2D(b) the phase separation of the two-phase photoresist material 221 into first phase (A) 231 and second phase (B) 232. Phase separation of the two-phase photoresist material is performed by either UV cure or thermal baking. UV cure can be performed in a conventional UV cure tool and the structure is then subjected to a UV exposure step at a substrate temperature from about 100° C. to about 400° C.

The UV exposure may be performed in the presence of an ambient gas such as an inert gas including, for example, He, Ar, Xe, $N_2$, or a mixture thereof such as a forming gas $N_2/O_2$. Optionally, a chemically active gas may be added to the inert gas. Examples of chemically active gases include: $H_2$, $CH_4$, trimethylsiliane, ethylene or silane derivatives having the formula $HSiRR_1R_2$ wherein R, $R_1$ and $R_2$ may be the same or different and are selected from the group consisting of methyl, ethyl, propyl, vinyl, allyl, methoxy and ethoxy.

The two different phase materials preferably have different etching selectivity. In a preferred embodiment second phase (B) 232 has higher etching-resistance than first phase (A) 231. As shown in FIG. 2D(b), the phase separation only happens locally on top of second layer material 203, which has a hydrophilic surface. This local phase separation is also caused by the topography features due to the difference in height between the cap layer 211 and the second layer material 203.

This local phase separation is also caused by the different interface properties between the two-phase photoresist 221 and second layer material 203 (where phase separation occurs) and the two-phase photoresist 221 and cap layer 211 (where phase separation does not occur). For enhancing the later etching selectivity, it is optional to remove first phase (A)

231 from the surface before the next process step. The removal step may be wet, plasma, or other chemical related processes. An example of a wet chemical stripping process that can be used is one wherein tetramethylammonium hydroxide (TMAH) is used as the chemical etchant.

Figure 2E:
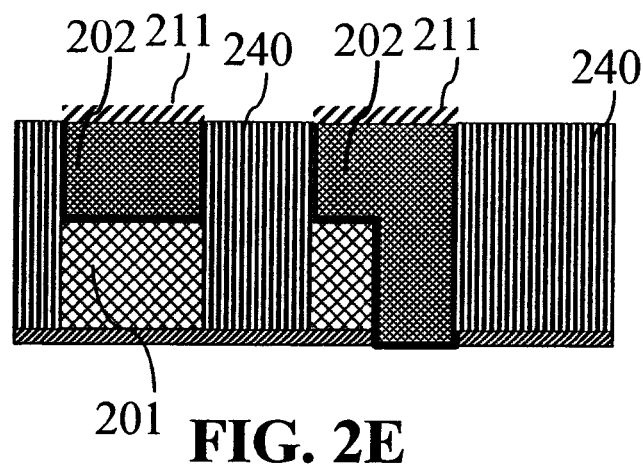

Referring now to FIG. 2E, there is illustrated the pattern transfer from the separated two-phase photoresist surrounding the cap layer 211 into the underlying insulator 201 through a RIE process. The RIE etch results in the formation of a columnar air gap structure 240 in the insulating material 201 underlying the two-phase separated photoresist. The insulating material 201 underlying the cap layer 211 is not effected. It is optional to repeat the above resist-deposition, phase-separation, and RIE processes in different orientations for creating a net air gap structure in order to further reduce the final dielectric capacitance. Since the second phase material (B) 232 has a higher etching selectivity that the first phase material (A) 231, first phase material 231 (A) will etch away during RIE and thereby leave columnar air gaps interspersed in the second phase material (B) 232.

Figure 2F:
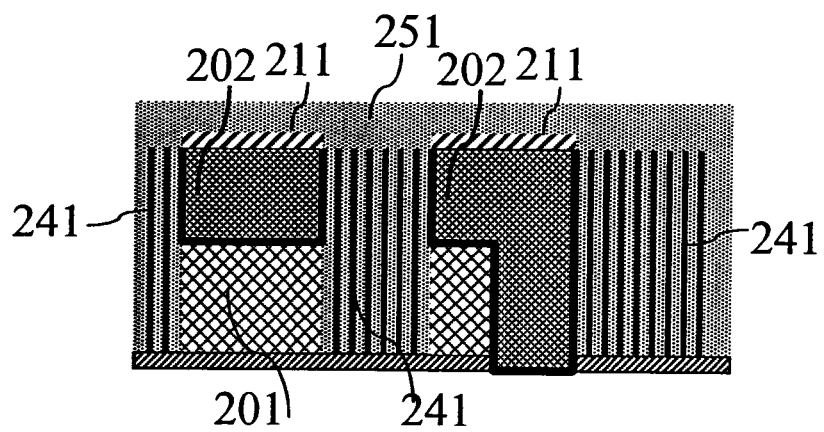
FIGS. 2F(a) and 2F(b) are schematic cross-sectional views illustrating preferred air gap structures according to the present invention.
Figure 2F:
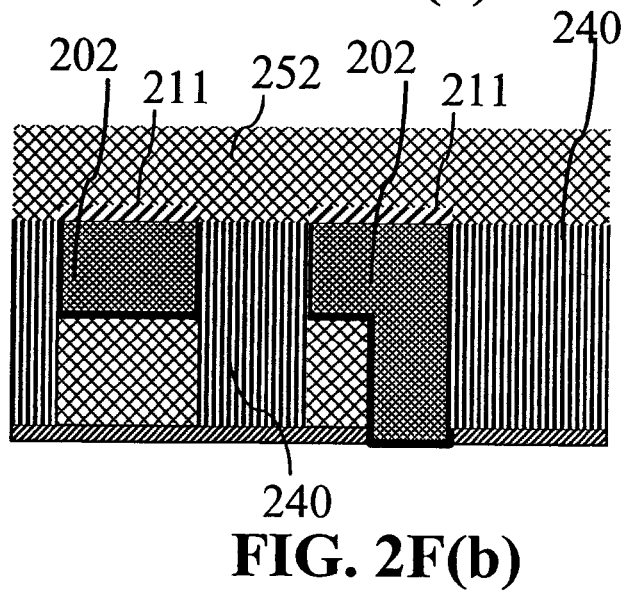

Referring now to FIG. 2F, a second insulator material 251 is then deposited on the surface of the columnar air gap structure 240 and cap layer 211 for further processing. Preferably, the second insulator layer 251 is a low-k material. In the embodiment shown in FIG. 2F(a), the deposited second insulator material 251 fills the columnar gaps thereby creating a two-k dielectric material 241. In this case the dielectric constant of the second insulator 251 is less than the one of the first insulator 201 in order to result in an overall lower value of k.

In the preferred embodiment shown in FIG. 2F(b), the deposited second insulator 252 does not fill the columnar air gaps leaving the air gaps in the final structure 240.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. An interconnect structure comprising:
   interconnect features embedded in a first dielectric layer, said interconnect features having patterned exposed interconnect areas;
   a cap layer on said exposed interconnect areas;
   a columnar air gap structure in a portion of said first dielectric layer surrounding said exposed interconnect areas; and
   a second dielectric material on said columnar air gap structure and cap layer.

2. The interconnect structure according to claim 1, wherein the second dielectric material fills the columnar air gap structure and wherein the dielectric constant of the second dielectric material is less than the dielectric constant of the first dielectric layer.

* * * * *